United States Patent
Richards et al.

(10) Patent No.: US 11,965,239 B2
(45) Date of Patent: Apr. 23, 2024

(54) METHOD FOR NUCLEATION OF CONDUCTIVE NITRIDE FILMS

(71) Applicant: ENTEGRIS, INC., Billerica, MA (US)

(72) Inventors: Gavin Richards, Newtown, CT (US); Thomas H. Baum, New Fairfield, CT (US); Han Wang, Cromwell, CT (US); Bryan C. Hendrix, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 444 days.

(21) Appl. No.: 17/161,332

(22) Filed: Jan. 28, 2021

(65) Prior Publication Data
US 2021/0395882 A1 Dec. 23, 2021

Related U.S. Application Data

(63) Continuation-in-part of application No. 16/904,179, filed on Jun. 17, 2020, now abandoned.

(51) Int. Cl.
*C23C 16/34* (2006.01)
*C23C 16/455* (2006.01)

(52) U.S. Cl.
CPC ........ *C23C 16/34* (2013.01); *C23C 16/45534* (2013.01); *C23C 16/45553* (2013.01)

(58) Field of Classification Search
CPC .............. C23C 16/34; C23C 16/45534; C23C 16/45553
See application file for complete search history.

(56) References Cited

U.S. PATENT DOCUMENTS

| | | | |
|---|---|---|---|
| 6,136,682 | A | 10/2000 | Hegde et al. |
| 7,838,441 | B2 | 11/2010 | Khandelwal |
| 10,023,462 | B2 | 7/2018 | Lansalot-Matras |
| 10,526,701 | B2 | 1/2020 | Kumar |
| 2001/0053600 | A1 | 12/2001 | Morales et al. |
| 2003/0059980 | A1 | 3/2003 | Chen |
| 2005/0277290 | A1 | 12/2005 | Yang |

(Continued)

FOREIGN PATENT DOCUMENTS

| | | |
|---|---|---|
| JP | 2018011009 A | 1/2018 |
| KR | 20190024841 A | 3/2019 |
| TW | 473167 B | 2/2015 |
| TW | 647329 B | 1/2019 |

OTHER PUBLICATIONS

Bui, H. Van et al.; "Growth Kinetics and Oxidation Mechanism of ALD TiN Thin Films Monitored by In Situ Spectroscopic Ellipsometry"; Journal of The Electrochemical Society, 158 (3) H214-H220 (2011).

(Continued)

*Primary Examiner* — Michael G Miller

(57) ABSTRACT

Provided is improved methodology for the nucleation of certain metal nitride substrate surfaces utilizing certain silicon-containing halides, silicon-containing amides, and certain metal precursors, in conjunction with nitrogen-containing reducing gases. While utilizing a pretreatment step, the methodology shows greatly improved nucleation wherein a microelectronic device substrate having such a metal nitride film deposited thereon has a thickness of about 10 Å to about 15 Å and less than about 1% of void area. Once such nucleation has been achieved, traditional layer-upon-layer deposition can rapidly take place.

18 Claims, 8 Drawing Sheets

(56) References Cited

U.S. PATENT DOCUMENTS

| | | |
|---|---|---|
| 2006/0009034 A1 | 1/2006 | Lai et al. |
| 2006/0258173 A1 | 11/2006 | Xiao |
| 2014/0273452 A1 | 9/2014 | Blomberg et al. |
| 2015/0099375 A1* | 4/2015 | Haripin ............... H01L 21/0217 438/793 |
| 2019/0267383 A1* | 8/2019 | Rocklein ........... H01L 21/28556 |

OTHER PUBLICATIONS

Miikkulainen, V. et al.; "Crystallinity of inorganic films grown by atomic layer deposition: Overview and general trends"; J. Appl. Phys. 113, 021301 (2013).

Satta, A. et al.; "Growth mechanism and continuity of atomic layer deposited TiN films on thermal SiO 2"; Journal of Applied Physics 92, 7641 (2002).

TAS Safety Data Sheet; Entegris; 2019.

Xiang, J. "Investigation of N Type Metal TiAlC by Thermal Atomic Layer Deposition Using TiCl4 and TEA as Precursors"; ECS Journal of Solid State Science and Technology, 5 (5) p. 299-p. 303 (2016).

Xiang, J. et al., "Investigation of TiAlC by Atomic Layer Deposition as N Type Work Function Metal for FinFET"; ECS Journal of Solid State Science and Technology, 4 (12) p. 441-p. 444 (2015).

Lee, Won-Jun et al., Growth studies and characterization of silicon nitride thin films deposited by alternating exposures to Si2Cl6 and NH3, Thin Solid Films, vol. 517, Issue 17, pp. 3975-3978 (published online: Feb. 4, 2009) (relevant passages: abstract; pp. 3977-3978).

\* cited by examiner

METHOD FOR NUCLEATION OF CONDUCTIVE NITRIDE FILMS

CROSS-REFERENCE TO RELATED APPLICATION

This application is a continuation-in-part application of U.S. Ser. No. 16/904,179 filed on Jun. 17, 2020, incorporated herein by reference, and claims priority thereto under 35 USC § 120.

TECHNICAL FIELD

This invention generally relates to methodology for forming certain thin films on microelectronic devices. In particular, the invention relates to methodology for the nucleation of metal nitride films onto the surface of a microelectronic device.

BACKGROUND

In the manufacturing of integrated circuits, titanium nitride has been of considerable interest given its relatively low resistivity and compatibility with CMOS (complementary metal oxide semiconductor) processes. Accordingly, titanium nitride is often used as a liner barrier and can be deposited over a silicon substrate. Such titanium nitride layers may be used as a barrier layer to inhibit the diffusion of metals into regions underlying the barrier layer. A conductive metal layer, such as a copper-containing layer or a tungsten containing layer, is usually deposited over the titanium nitride layer. The titanium layer may be formed by a chemical vapor deposition (CVD) process, an atomic layer deposition (ALD) process, and/or a physical vapor deposition (PVD) process. For example, the titanium nitride layer may be formed by reacting titanium tetrachloride with a reducing agent such as ammonia during a CVD process and the titanium nitride layer may be formed by reacting titanium tetrachloride with ammonia in a CVD process. Thereafter, the conductive material may be deposited onto the microelectronic device substrate. See, for example, U.S. Pat. No. 7,838,441. The deposition of materials such as titanium nitride and titanium silicon nitride are however plagued with difficulties in the initiation of the deposition on the microelectronic device substrate, and the building of film thickness based on the number of deposition sequences is relatively poor in the so-called initial, non-linear growth region. See, for example, "Growth Mechanism and Continuity of Atomic Layer Deposited TiN films on Thermal $SiO_2$", A. Satta, et al., *Journal of Applied Physics*, Volume 92, Number 12, pp. 7641-7646 (2002).

Thus, there is a need for improved methodologies for depositing titanium-containing films onto microelectronic device substrates, in particular during the initial formation, or nucleation, of the substrate surface with such titanium-containing materials.

SUMMARY

In summary, the invention provides improved methodology for the nucleation of certain metal nitride substrate surfaces utilizing certain silicon-containing halides, silicon-containing amides, and certain metal precursors, in conjunction with nitrogen-containing reducing gases. While utilizing a pretreatment step, the methodology shows greatly improved nucleation wherein a microelectronic device substrate having such a metal nitride film deposited thereon has a thickness of about 10 Å to about 15 Å and less than about 1% of void area. Once such nucleation has been achieved, traditional layer-upon-layer deposition can rapidly take place.

BRIEF DESCRIPTION OF THE DRAWINGS

The disclosure may be more completely understood in consideration of the following description of various illustrative embodiments in connection with the accompanying drawings.

Figure 1:
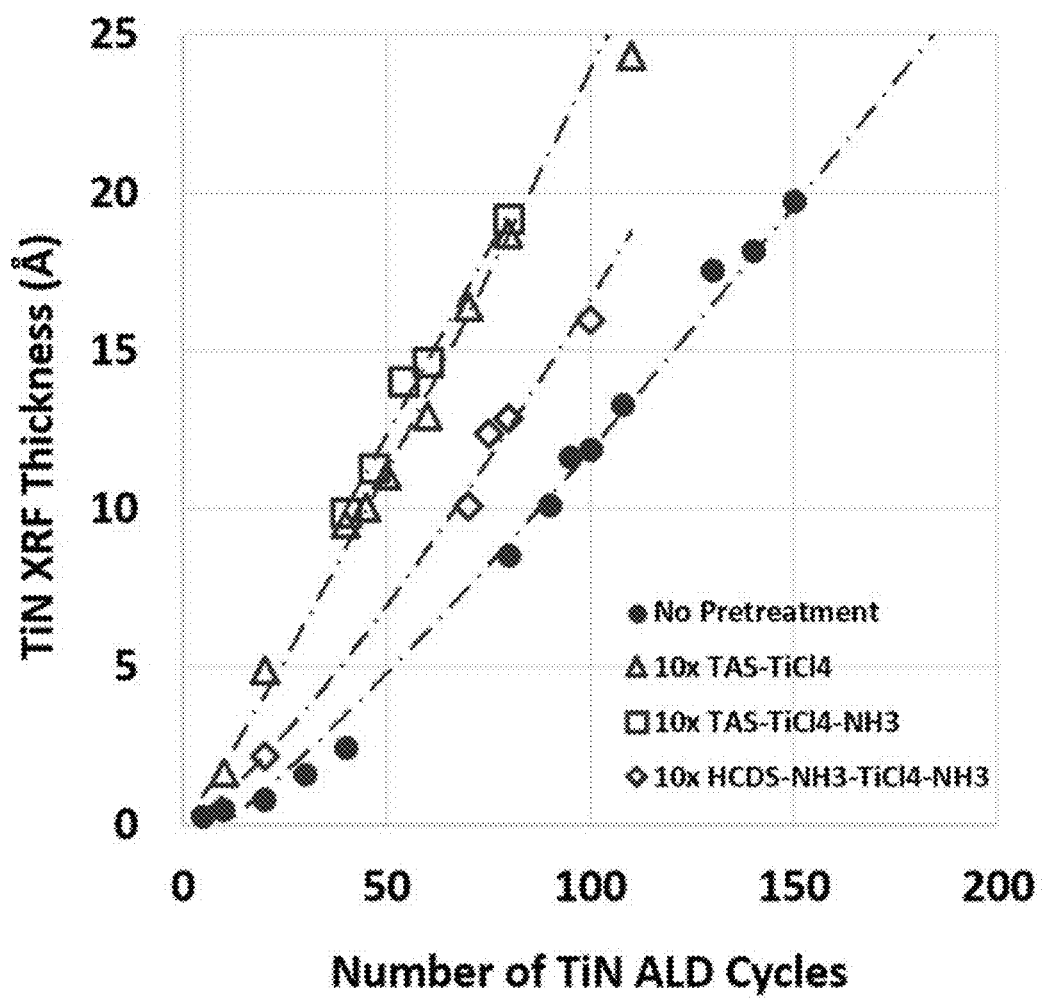
FIG. 1 is a plot of thickness versus number of titanium nitride cycles in an atomic layer deposition. This data shows the effect of early nucleation of the microelectronic device substrate with $TAS/TiCl_4$, $TAS/TiCl_4/NH_3$, and $HCDS/NH_3/TiCl_4/NH_3$. For $TAS/TiCl_4/NH_3$ and $HCDS/NH_3/TiCl_4/NH_3$ pretreatments, the number of TiN (titanium nitride) ALD cycles includes 10 TiN cycles in the pretreatments; For example, if the number=100, it means 10 cycles of $HCDS/NH_3/TiCl_4/NH_3$ and 90 cycles of titanium nitride deposition using, for example, $TiCl_4/NH_3$. "TAS" (bis-t-amyl ethylene silylene) is an organosilylene product commercially available from Entegris, Inc., Billerica, MA.
Figure 2:
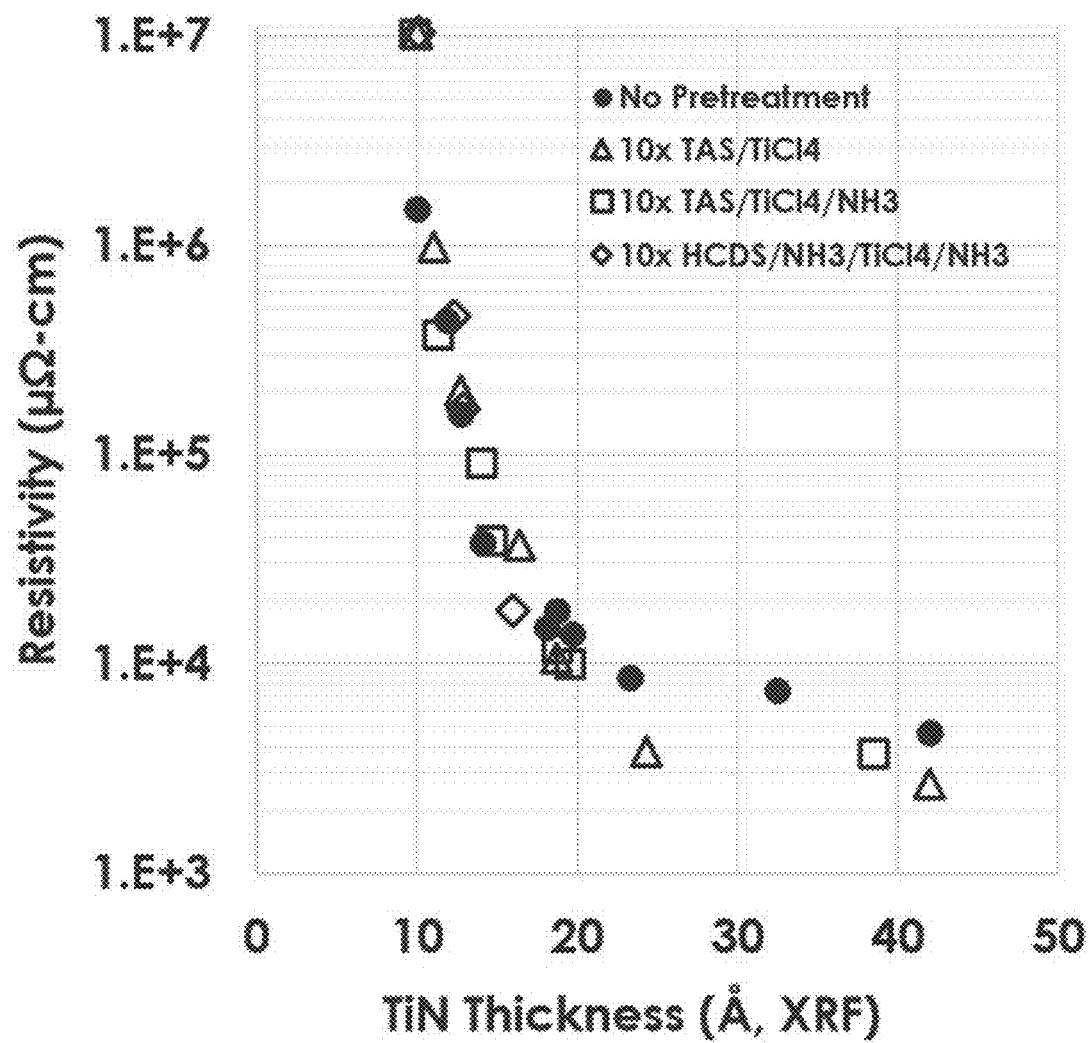
FIG. 2 is a plot of resistivity in $\mu\Omega$-cm versus titanium nitride thickness in angstroms. TiN resistivity was plotted as function of TiN film thickness measured by XRF on both untreated and pretreated thermal $SiO_2$ substrates.
Figure 3:
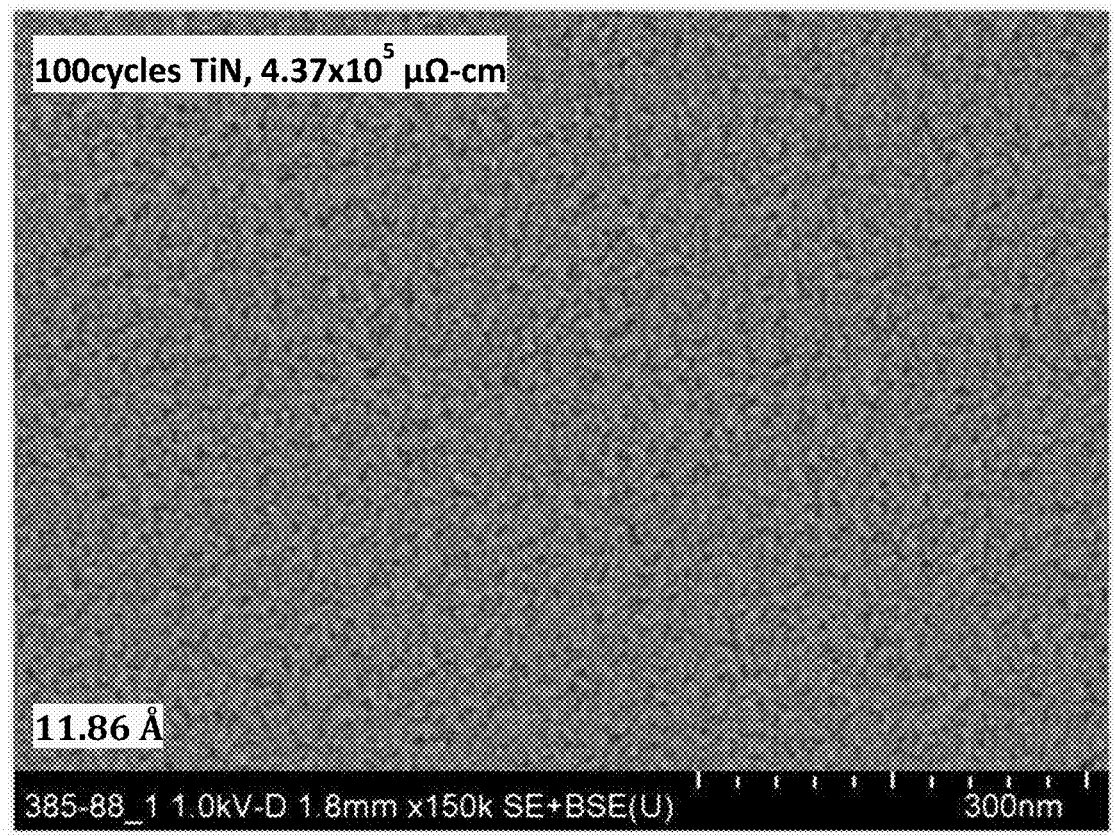
FIG. 3 is a scanning electronic micrograph (SEM) of the surface of a thermal $SiO_2$ substrate after ALD with 100 cycles of $TiCl_4/NH_3$ with no pre-treatment.
Figure 4:
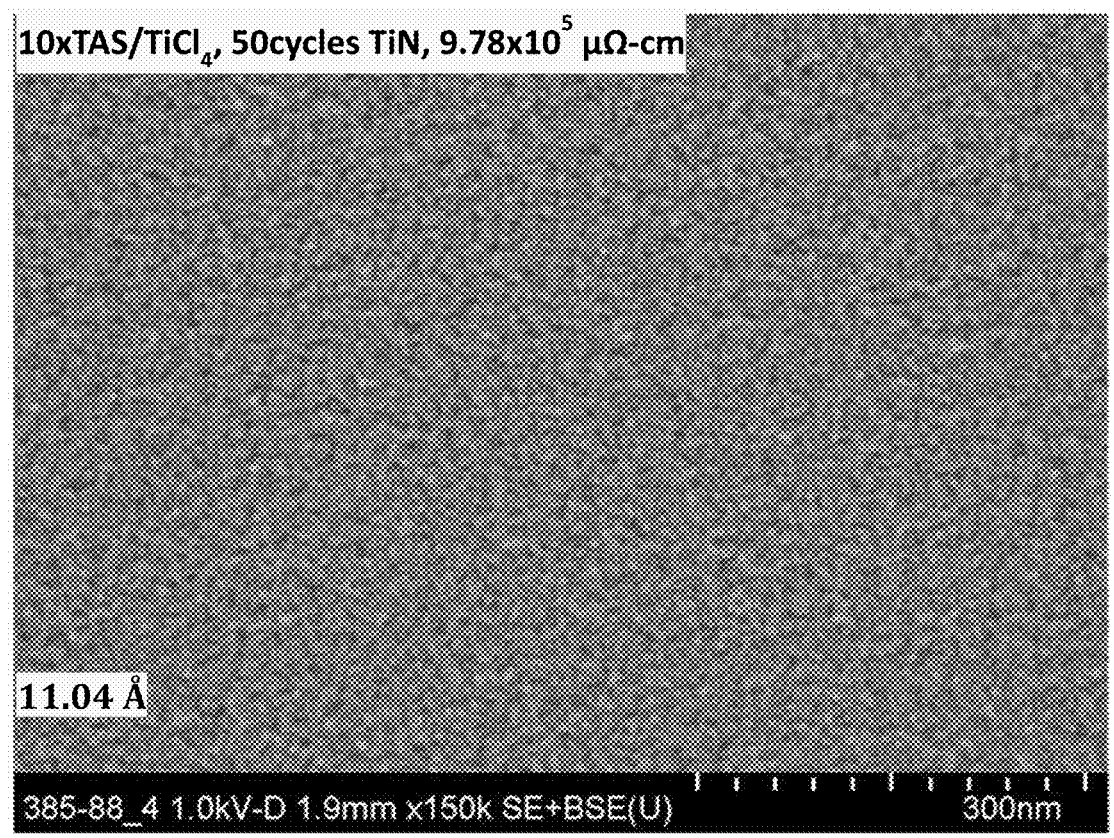
FIG. 4 is an SEM of the surface of a thermal $SiO_2$ substrate which was subjected to ALD with ten cycles of $TAS/TiCl_4$, followed by 50 cycles with $TiCl_4/NH_3$. This SEM shows a greatly improved surface exhibiting considerably fewer void spaces, and thus better nucleation, in comparison to a similar experiment with no pre-treatment (but twice as many cycles). Comparing the void spaces of FIG. 4 to FIG. 3, the void space in FIG. 4 is 0.8% versus that of FIG. 3 is 2.7%. (Calculated using ImageJ software available from the National Institutes of Health.)
Figure 5:
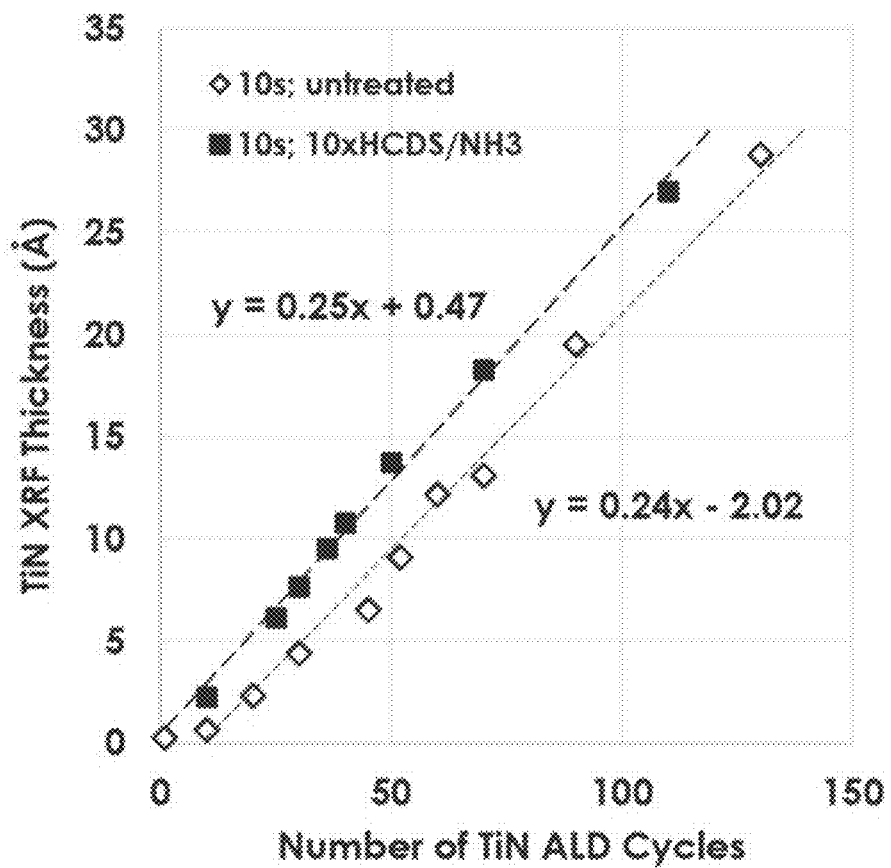
FIG. 5 is a plot of TiN thickness (measured by XRF) versus number of TiN cycles in an atomic layer deposition. This data shows the effect of early nucleation of the microelectronic device substrate with 10× $HCDS/NH_3$ pretreatment.
Figure 6:
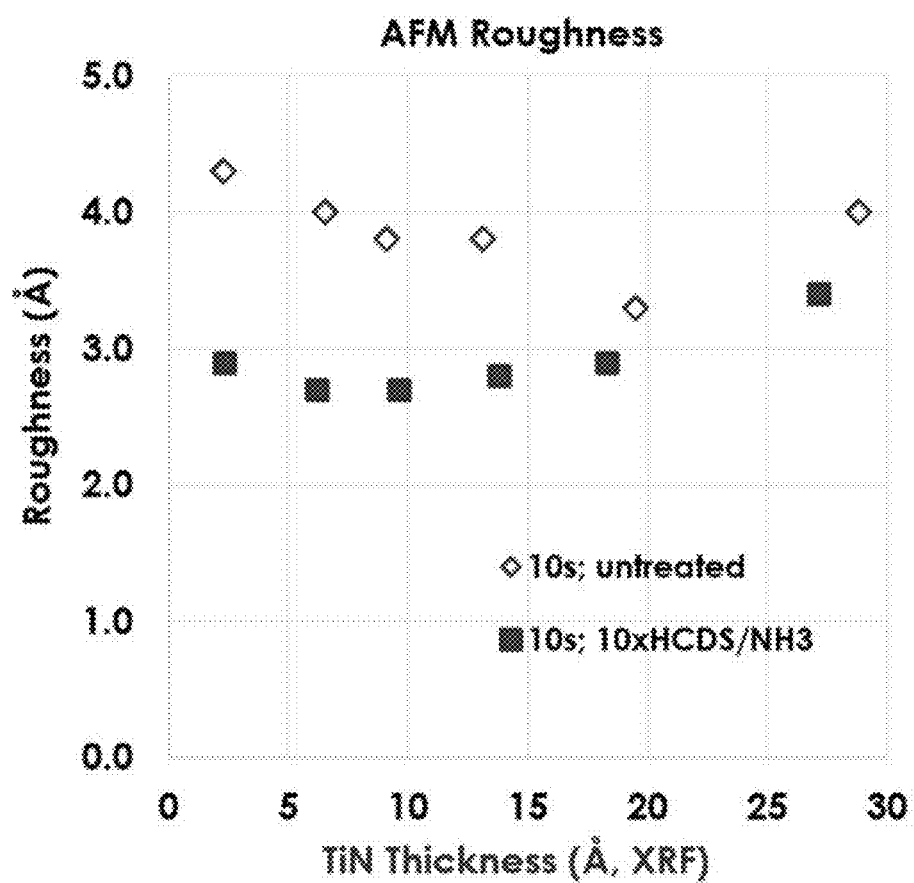
FIG. 6 is a plot of roughness in angstroms versus titanium nitride thickness in angstroms as measured by XRF. The roughness is measured by atomic force microscope (AFM), which measures force between a probe and the sample. The open triangle points represent TiN on untreated $SiO_2$, the solid square points represent TiN on 10× $HCDS/NH_3$-pretreated $SiO_2$. This data shows TiN films on 10× $HCDS/NH_3$-pretreated $SiO_2$ are at least 25% smoother than untreated ones, especially for titanium nitride having a thickness of less than 15 Å.
Figure 7:
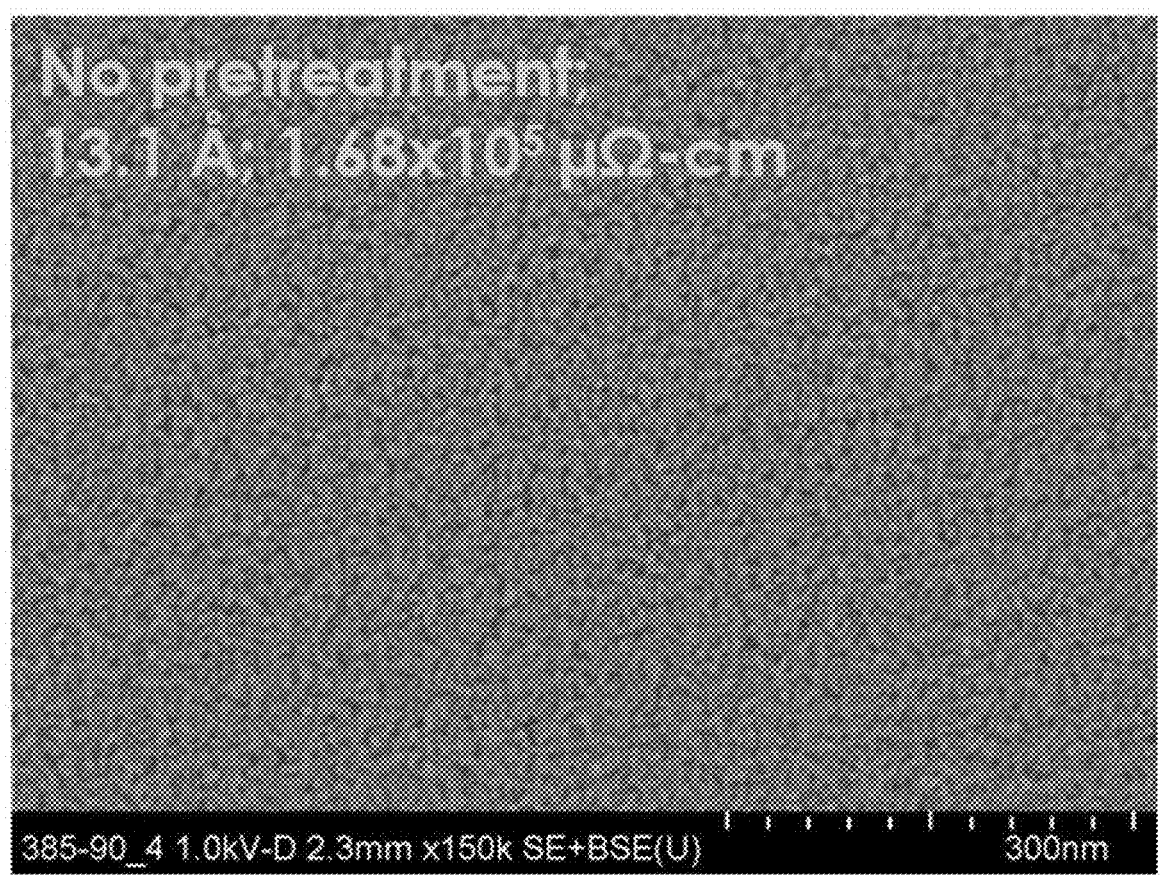
FIG. 7 is an SEM of the surface of a thermal $SiO_2$ substrate after ALD with 70 cycles of $TiCl_4/NH_3$ with no pre-treatment.
Figure 8:
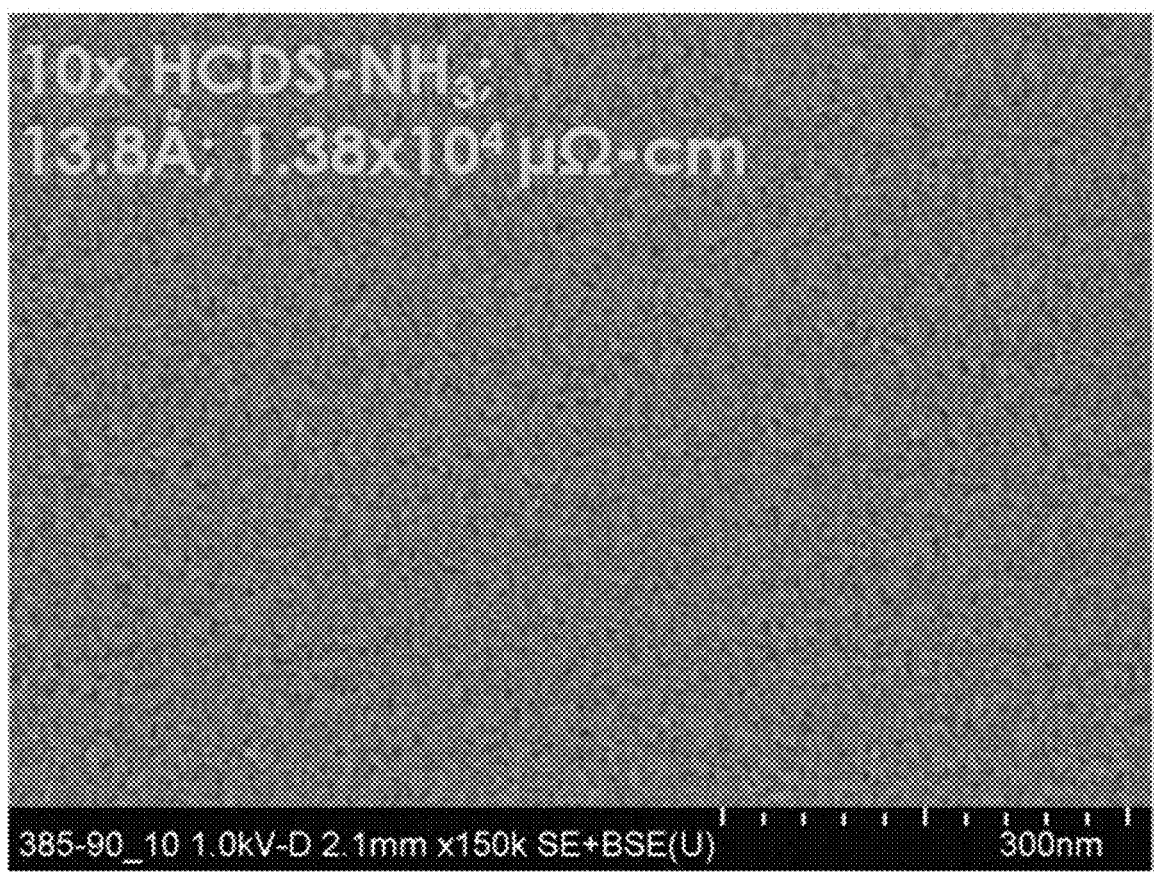
FIG. 8 is an SEM of the surface of a thermal $SiO_2$ substrate which was subjected to ALD with ten cycles of $HCDS/NH_3$, followed by 50 cycles with $TiCl_4/NH_3$. This SEM shows a greatly improved surface exhibiting considerably fewer void spaces, and thus better nucleation, in comparison to a similar experiment with no pre-treatment. Comparing the void spaces of FIG. 8 to FIG. 7, the void space in FIG. 8 is 0.2% versus that of FIG. 7 is 3.7%.

(Calculated using ImageJ software available from the National Institutes of Health.)

While the disclosure is amenable to various modifications and alternative forms, specifics thereof have been shown by way of example in the figures and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g. 1 to 5 includes 1, 1.5, 2, 2.75, 3, 3.80, 4 and 5).

In a first aspect, the invention provides a pretreatment process for metal nitride nucleation on the surface of a microelectronic device substrate in a reaction zone, which comprises:

I. introducing compounds chosen from A, B, and C into a reaction zone under pulsed vapor deposition conditions, wherein said pulsed vapor deposition conditions comprise a plurality of pulse sequences, wherein at least two of compounds, A, B, and C are introduced into said reaction zone, one of which is A, sequentially and in any order, each optionally followed by a purge step with an inert gas, to define a first cycle of pulse sequences, wherein said plurality comprises at least three cycles, wherein A, B, and C are defined as:
  A. a precursor chosen from silicon-containing halides and silicon-containing amides;
  B. a metal precursor, wherein said metal is chosen from titanium, tantalum, molybdenum, tungsten, and niobium; and
  C. a nitrogen-containing reducing gas, wherein said nitrogen-containing reducing gas is introduced into said reaction zone once or twice per cycle of each pulse sequence.

In one embodiment, the cycle of pulse sequences in this pretreatment step is repeated about 3 to about 15 times. In another embodiment, A is bis-t-amyl ethylene silylene and B is $TiCl_4$. In another embodiment, the first cycle of pulse sequences is hexachlorodisilane; $NH_3$; $TiCl_4$; and $NH_3$. In another embodiment the first cycle of pulse sequences is (i) hexachlorodisilane and $NH_3$; (ii) hexachlorodisilane and $N_2H_4$; (iii) hexachlordisilane and 1,1-dimethyl hydrazine; or (iv) hexachlorodisilane and 1,2-dimethyl hydrazine.

In a second aspect, the invention provides a process for metal nitride nucleation on the surface of a microelectronic device substrate in a reaction zone, which comprises:

I. introducing compounds chosen from A, B, and C into a reaction zone under pulsed vapor deposition conditions, wherein said pulsed vapor deposition conditions comprise a plurality of pulse sequences, wherein at least two of compounds, A, B, and C are introduced into said reaction zone, one of which is A, sequentially and in any order, each optionally followed by a purge step with an inert gas, to define a first cycle of pulse sequences, wherein said plurality comprises at least three cycles, wherein A, B, and C are defined as:
  A. a precursor chosen from silicon-containing halides and silicon-containing amides;
  B. a metal precursor, wherein said metal is chosen from titanium, tantalum, molybdenum, tungsten, and niobium; and
  C. a nitrogen-containing reducing gas, wherein said nitrogen-containing reducing gas is introduced into said reaction zone once or twice per cycle of each pulse sequence; followed by II. introducing into said reaction zone a second cycle of pulse sequences comprising introducing compounds D and E into said reaction zone, in either order, each optionally followed by purging with an inert gas:
  D. a metal precursor, wherein said metal is chosen from titanium, tantalum, molybdenum, tungsten, and niobium; and
  E. a nitrogen-containing reducing gas; and
repeating said second cycle of pulse sequences for a sufficient number of iterations to establish a metal nitride nucleation on a substrate to afford a coverage representing less than about 1% of void areas in a film having a thickness of about 10 Å to about 15 Å.

In one embodiment, the silicon containing halides and silicon-containing amides are chosen from compounds of the formulae:

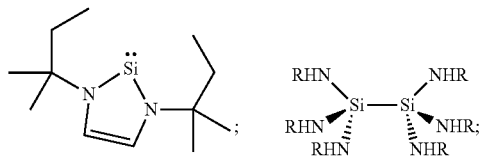

wherein each R is independently chosen from $C_1$-$C_4$ alkyl;

hexachlorodisilane; silicon tetraiodide; and trisilicon octochloride.

In one embodiment, the substrate surface comprises silicon dioxide. In another embodiment, the substrate surface is chosen from aluminum oxide, zirconium oxide, hafnium oxide, and their mixtures.

As used herein, the term "metal nitride" includes films having varying proportions of metals chosen from titanium, tantalum, molybdenum, tungsten, and niobium along with nitrogen. In such films, the atomic percentage of metal in the film may vary depending on the metal and the method of deposition. Additionally, the metal nitride containing film may be further comprised of about 2% to about 20% of atomic percentage of silicon. Such metal nitride films may be prepared using known metal precursors for same, such as $TiCl_4$; $TiI_4$; tetrakis(dimethylamido)titanium (TDMAT); $Ti(NCH_2CH_3)_xCl_y$; $TaCl_5$; $TaF_5$; $MoCl_5$; $WCl_5$; $WF_6$; $NbCl_5$; and the like. The precursors set forth herein can be used alone, or in combination or in sequences with different precursors. For example, in one embodiment, the titanium precursor tetrakis(dimethylamido)titanium can be utilized until a film of about 1 monolayer has been achieved and thereafter a chlorinated precursor such as $TiCl_4$ can be utilized to further build the film. For exemplary metal nitride precursors, see for example to *Journal of Applied Physics*

113, 021301 (2013) "Crystallinity of inorganic films grown by atomic layer deposition: overview and general trends" Table IV (page 48-50). Examples include but are not limited to TiCl$_4$, TiI$_4$, Ti(N(CH$_3$)$_2$)$_4$, Ti(N(CH$_3$CH$_2$)(CH$_3$))$_4$, TaCl$_5$, TaCl.S(CH$_3$CH$_2$)$_2$, TaBr$_5$, Ta(N(CH$_3$)$_2$)$_5$, Ta(N(CH$_3$CH$_2$)CH$_3$)$_5$, Ta(isopropyl-N)(N(CH$_3$CH$_2$)CH$_3$)$_3$, Ta(tButyl-N)(N(CH$_3$CH$_2$)$_2$)$_3$, Ta(t-amyl-N)(N(CH$_3$)$_2$)$_3$, NbCl$_5$, WF$_6$, W(tBu-N)$_2$(N(CH$_3$)$_2$)$_2$, W$_2$(N(CH$_3$)$_2$)$_6$, and the like.

In one embodiment, metal precursor is chosen from TiCl$_4$, TiI$_4$, Ti(NCH$_2$CH$_3$)$_x$Cl$_y$, (wherein x+y=4), compounds of the formula Ti(NR$_2$)$_4$ wherein R$_2$ is C$_1$-C$_4$ alkyl (such as tetrakis(dimethylamido)titanium), tertiaryamylimido-tris(dimethylamido)titanium, TaCl$_5$, MoCl$_5$, WCl$_5$, and NbCl$_5$. In one embodiment, the titanium precursor is chosen from TiCl$_4$, TiI$_4$, Ti(NCH$_2$CH$_3$)$_x$Cl$_y$, (wherein x+y=4), compounds of the formula Ti(NR$_2$)$_4$ wherein R$_2$ is C$_1$-C$_4$ alkyl (such as tetrakis(dimethylamido)titanium), tertiaryamylimido-tris(dimethylamido)titanium. In another embodiment, the titanium precursor is TiCl$_4$.

In one embodiment, the metal nitride is chosen from titanium nitride, tantalum nitride, tungsten nitride, and niobium nitride.

In one embodiment A is chosen from:

i. a compound of the formula

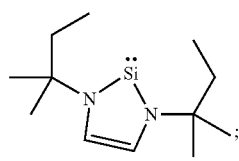

ii. a compound of the formula

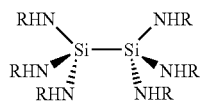

wherein each R is independently chosen from C$_1$-C$_4$ alkyl;

iii. hexachlorodisilane;

iv. silicon tetraiodide; and v. trisilicon octochloride; and the metal is chosen from titanium and tantalum.

In one embodiment, the precursor compound A is a compound of the formula

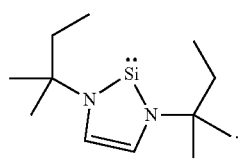

In one embodiment, the precursor compound A is hexachlorodisilane.

In one embodiment, the precursor compound A is a compound of the formula

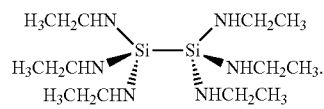

In one embodiment, the cycle of pulse sequences is repeated about 3 to about 15 times.

In a third aspect, the invention provides a process for the titanium nitride nucleation on the surface of a microelectronic device substrate in a reaction zone, which comprises:

I. introducing compounds chosen from A, B, and C into a reaction zone under pulsed vapor deposition conditions, wherein said pulsed vapor deposition conditions comprise a plurality of pulse sequences, wherein at least two of compounds, A, B, and C are introduced into said reaction zone, one of which is A, sequentially and in any order, each optionally followed by a purge step with an inert gas, to define a first cycle of pulse sequences, wherein said plurality comprises at least three cycles, wherein A, B, and C are defined as:

A. a compound of the formula

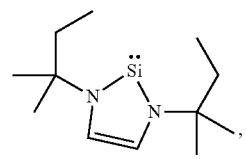

B. TiCl$_4$, and

C. ammonia; followed by

II. introducing into said reaction zone a second cycle of pulse sequences comprising introducing compounds D and E into said reaction zone, in either order:

D. a titanium precursor; and

E. a nitrogen-containing reducing gas; and repeating said second cycle of pulse sequences for a sufficient number of iterations to establish a titanium nitride nucleation on a substrate to afford a coverage presenting less than about 1% of void areas in a film having a thickness of about 10 Å to about 15 Å.

In a fourth aspect, the invention provides a process for titanium nitride nucleation on the surface of a microelectronic device substrate in a reaction zone, which comprises:

I. introducing hexachlorodisilane, ammonia, TiCl$_4$, and ammonia, sequentially, into a reaction zone under pulsed vapor deposition conditions to define one cycle of a first pulse sequence, wherein said pulsed vapor deposition conditions comprise at least three of said cycles, each optionally followed by a purge step with an inert gas; followed by II. introducing into said reaction zone a cycle of second pulse sequences comprising introducing compounds D and E into said reaction zone, in either order, each optionally followed by a purge step with an inert gas:

D. a titanium precursor; and

E. a nitrogen-containing reducing gas; and repeating said cycle of second pulse sequences for a sufficient number of iterations to establish a titanium nitride nucleation on a substrate to afford a coverage presenting less than about 1% of void areas in a film having a thickness of about 10 Å to about 15 Å.

In a fifth aspect, the invention provides a process for the metal nitride nucleation on the surface of a microelectronic device substrate in a reaction zone, which comprises:
  I. introducing hexachlorodisilane and a reducing gas, sequentially, into a reaction zone under pulsed vapor deposition conditions, wherein said pulsed vapor deposition conditions comprise a plurality of pulse sequences, each optionally followed by a purge step with an inert gas, to define a first cycle of pulse sequences, wherein said plurality comprises at least three cycles,
  II. introducing into said reaction zone a second cycle of pulse sequences comprising introducing compounds A and B into said reaction zone, in either order:
    A. a metal precursor, wherein said metal is chosen from titanium, tantalum, molybdenum, tungsten, and niobium; and
    B. a nitrogen-containing reducing gas; and
  repeating said cycle of second pulse sequences for a sufficient number of iterations to establish a metal nitride nucleation on a substrate to provide a film having a thickness of about 10 Å to about 15 Å.

In another embodiment, the resulting film will exhibit an AFM roughness of at least about 25% less than a corresponding film which is formed by not utilizing step I.

In a sixth aspect, the invention provides a process for titanium nitride nucleation on the surface of a microelectronic device substrate in a reaction zone, which comprises:
  I. introducing hexachlorodisilane and a nitrogen-containing reducing gas, sequentially, into a reaction zone under pulsed vapor deposition conditions to define a first cycle of a first pulse sequences, wherein said pulsed vapor deposition conditions comprise at least three of said cycles, each optionally followed by a purge step with an inert gas; followed by
  II. introducing into said reaction zone a second cycle of pulse sequences comprising introducing compounds D and E into said reaction zone, in either order, each optionally followed by a purge step with an inert gas:
    D. a titanium precursor; and
    E. a nitrogen-containing reducing gas; and
  repeating said second cycle of pulse sequences for a sufficient number of iterations to establish a titanium nitride nucleation to provide a film having a thickness of about 10 Å to about 15 Å.

In another embodiment, the resulting film exhibits an AFM roughness of at least about 25% less than a corresponding film which is formed by not utilizing step I.

In one embodiment, in these fifth and sixth aspects, the nitrogen-containing reducing gas is ammonia. In another embodiment, the nitrogen-containing reducing gas is chosen from hydrazine; 1,1-dimethyl hydrazine; and 1,2-dimethyl hydrazine.

Thus, in the second, third, fourth, fifth, and sixth aspects of the invention, there is provided improved methodology for the nucleation of a substrate surface, for example a microelectronic device substrate, with a metal nitride. Accordingly, in a seventh aspect, the invention provides a microelectronic device substrate having deposited thereon a metal nitride film having a thickness of about 10 Å to about 15 Å and less than about 1% of void area. In one embodiment, the metal nitride is comprised of titanium nitride.

Once nucleation has been achieved, i.e., a film having a thickness of about 10-15 Å, with less than about 1% void area, a further deposition of metal nitride species can proceed in layer-by-layer mode.

Accordingly, in an eighth aspect, the invention provides a process for depositing a metal nitride on the surface of a substrate, which comprises the process of any one of the above aspects, further comprising introducing into the reaction zone (i) at least one metal precursor and (i) at least one nitrogen containing reducing gas, in either order, each followed by an optional purge step with an inert gas, to define a third cycle of pulse sequences, and repeating said third cycle of pulse sequences until a metal nitride film of a desired thickness has been obtained.

In certain embodiments, the pulse time (i.e., duration of precursor exposure to the substrate) for the compounds, A, B, or C depicted above ranges between about 1 and 60 seconds. When a purge step is utilized, the duration of said purge step is from about 1 to 60, 1 to 4 seconds or 1 to 2 seconds, depending on the tool utilized and depending on the identity of compound A, B, and C, as well as the substrate on which deposition occurs. In other embodiments, the pulse time for each compound ranges from 0.1 to 60 or 20 to 40 seconds, again depending upon the tool utilized. In other embodiments, the pulse time for each compound ranges from about 5 to about 10 seconds.

In one embodiment, the vapor deposition conditions comprise a temperature of about 250° C. to about 750° C., and a pressure of about 0.5 to about 1000 Torr, or 1 to 30 Torr. In another embodiment, the vapor deposition conditions comprise a temperature of about 350° to about 450° C., depending on the tool utilized and depending on the identity of compound A, B, and C, as well as the substrate on which deposition occurs.

The processes which can be employed for forming high-purity thin metal, for example, titanium-containing films include any suitable vapor deposition technique, such as digital or pulsed CVD, ALD, and pulsed plasma processes. Such vapor deposition processes can be utilized to form titanium-containing films on at least one substrate surface of microelectronic devices to form films having a thickness of from about 20 angstroms to about 2000 angstroms.

In the process of the invention, the compounds above may be reacted with the desired microelectronic device substrate in any pulsing regime, for example, in a single wafer CVD, ALD and/or PECVD or PEALD chamber, or in a furnace containing multiple wafers.

Alternately, the process of the invention can be conducted as an ALD or ALD-like process. As used herein, the terms "ALD or ALD-like" refers to processes such as (i) each reactant A, B, and C is introduced sequentially into a reactor such as a single wafer ALD reactor, semi-batch ALD reactor, or batch furnace ALD reactor, or (ii) each reactant, is exposed to the substrate or microelectronic device surface by moving or rotating the substrate to different sections of the reactor and each section is separated by an inert gas curtain, i.e., spatial ALD reactor or roll to roll ALD reactor.

As used herein, the term "reducing gas comprising nitrogen" includes gases chosen from hydrazine ($N_2H_4$), methyl hydrazine, t-butyl hydrazine, 1,1-dimethylhydrazine, 1,2-dimethylhydrazine, and $NH_3$.

The deposition methods disclosed herein may involve one or more purge gases. The purge gas, which is used to purge away unconsumed reactants and/or reaction by-products, is an inert gas that does not react with the precursors. Exemplary purge gases include, but are not limited to, argon, nitrogen, helium, neon, and mixtures thereof. In certain embodiments, a purge gas such as Ar is supplied into the reactor at a flow rate ranging from about 10 to about 2000 sccm for about 0.1 to 1000 seconds, thereby purging the unreacted material and any by-product that may remain in the reactor. Similarly, such inert gases may be used as carrier gases for the various precursors A, B, and C above. Concentration and flow rate may vary depending upon the particular tool utilized.

Energy is applied to the precursor compounds and reducing gas, or combination thereof to induce reaction and to form the metal nitride-containing film on the microelectronic device substrate. Such energy can be provided by, but not limited to, thermal, pulsed thermal, plasma, pulsed plasma, helicon plasma, high density plasma, inductively coupled plasma, photon, remote plasma methods, and combinations thereof; in the case of plasma energy, such regimes may be utilized for precursors C as described above. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated 'remotely' of the reaction zone and substrate, being supplied into the reactor. Other examples of vapor deposition methodology is described in U.S. Pat. No. 10,526,701, incorporated herein by reference.

As used herein, the term "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly. Such microelectronic devices contain at least one substrate, which can be chosen from, for example, silicon, $SiO_2$, $Si_3N_4$, aluminum oxide, zirconium oxide, hafnium oxide, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, porous inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

EXAMPLES

In this example, TiN was deposited on both untreated and pretreated thermal $SiO_2$ surfaces.

The TiN film was deposited by an ALD process using titanium tetrachloride ($TiCl_4$) as a first precursor and ammonia ($NH_3$) as a second precursor. Each deposition cycle was carried out with the substrate at temperature of 350° C. and a reaction chamber pressure of 3 Torr. Each deposition cycle included a $TiCl_4$ vapor draw of 0.2 second, an inert Argon purge for 20 seconds, an $NH_3$ pulse of 0.5 second, and an inert Argon purge for 20 seconds.

The first pretreatment layer was deposited by an ALD process using TAS as a first precursor and $TiCl_4$ as a second precursor. Each deposition cycle was carried out with the substrate at temperature of 350° C. and a reaction chamber pressure of 3 Torr. Each deposition cycle included a TAS vapor pulse of 1.0 second, an inert Argon purge for 20 seconds, a $TiCl_4$ vapor draw of 0.2 second, and an inert Argon purge for 20 seconds. A total of 10 cycles was performed, and then followed by a TiN process.

The second pretreatment layer was deposited by an ALD process using TAS as a first precursor, $TiCl_4$ as a second precursor, and $NH_3$ as a third precursor. Each deposition cycle was carried out with the substrate at temperature of 350° C. and a reaction chamber pressure of 3 Torr. Each deposition cycle included a TAS vapor pulse of 1.0 second, an inert Argon purge for 20 seconds, a $TiCl_4$ vapor draw of 0.2 second, an inert Argon purge for 20 seconds, an $NH_3$ pulse of 0.5 second, and an inert Argon purge for 20 seconds. A total of 10 cycles was performed, and then followed by a TiN process.

The third pretreatment layer was deposited by an ALD process using HCDS as a first precursor, $TiCl_4$ as a second precursor, and $NH_3$ as a third precursor. Each deposition cycle was carried out with the substrate at temperature of 350° C. and a reaction chamber pressure of 3 Torr. Each deposition cycle included a HCDS or pulse of 1.0 second, an inert Argon purge for 20 seconds, an $NH_3$ pulse of 0.5 second, and an inert Argon purge for 20 seconds, a $TiCl_4$ vapor draw of 0.2 second, an inert Argon purge for 20 seconds, an $NH_3$ pulse of 0.5 second, and an inert Argon purge for 20 seconds. A total of 10 cycles was performed, and then followed by a TiN process.

Description: all deposition and pretreatments were processed on thermal $SiO_2$ substrates. Each deposition cycle was carried out with the substrate at temperature of 350° C. and a reaction chamber pressure of 3 Torr. When TiN film was directly deposited on thermal $SiO_2$, 10 cycles only gave 2.2 Ti atom/$nm^2$, by comparison, both TAS—$TiCl_4$—$NH_3$ and HCDS—$NH_3$—$TiCl_4$—$NH_3$ pretreatment methods can increase the amount of Ti deposited for the same number of cycles, which demonstrate the positive effects by doing pretreatment before TiN ALD.

| Sequence | Purpose | #Cycles | Measured Ti Density (atom/$nm^2$) |
|---|---|---|---|
| $TiCl_4$—$NH_3$ | Deposition | 10 | 2.2 |
| TAS-$TiCl_4$ | Pretreatment | 10 | 1.3 |
| TAS-$TiCl_4$—$NH_3$ | Pretreatment | 10 | 4.4 |
| HCDS-$NH_3$—$TiCl_4$—$NH_3$ | Pretreatment | 10 | 3.1 |

In this example, TiN was deposited on both untreated and pretreated thermal $SiO_2$ surfaces.

This pretreatment layer was deposited by an ALD process using HCDS as a first precursor and $NH_3$ as a second precursor. Each deposition cycle was carried out with the substrate at temperature of 350° C. and a reaction chamber pressure of 3 Torr. Each deposition cycle included a HCDS or pulse of 30 second, an inert Argon purge for 20 seconds, an $NH_3$ pulse of 2 second, and an inert Argon purge for 20 seconds. A total of 10 cycles was performed, and then followed by a TiN process.

| Experiment | Pretreatment | TiN cycles | XRF Thickness (Å) | Resistivity (μΩ-cm) | Roughness (Å) |
|---|---|---|---|---|---|
| A | none | 52 | 9.1 | n/a | 3.8 |
| B | 10x HCDS-NH$_3$ | 36 | 9.6 | 1.34 × 10$^6$ | 2.7 |

Other Aspects of the Invention:

In another aspect (I), the invention provides a process for the metal nitride nucleation on the surface of a microelectronic device substrate in a reaction zone, which comprises the steps:

I. introducing hexachlorodisilane and a reducing gas, sequentially, into a reaction zone under pulsed vapor deposition conditions, wherein said pulsed vapor deposition conditions comprise a plurality of pulse sequences, each optionally followed by a purge step with an inert gas, to define a first cycle of pulse sequences, wherein said plurality comprises at least three cycles, and II. introducing into said reaction zone a second cycle of pulse sequences comprising introducing compounds A and B into said reaction zone, in either order:
  A. a metal precursor, wherein said metal is chosen from titanium, tantalum, molybdenum, tungsten, and niobium; and
  B. a nitrogen-containing reducing gas; and
repeating said cycle of second pulse sequences for a sufficient number of iterations to establish a metal nitride nucleation on a substrate to provide a film having a thickness of about 10 Å to about 15 Å.

In another aspect (II), the invention provides the process of aspect (I), wherein the nitrogen-containing reducing gas is N$_2$H$_4$.

In another aspect (III), the invention provides a process for titanium nitride nucleation on the surface of a microelectronic device substrate in a reaction zone, which comprises:

I. introducing hexachlorodisilane and a nitrogen-containing reducing gas, sequentially, into a reaction zone under pulsed vapor deposition conditions to define a first cycle of a first pulse sequences, wherein said pulsed vapor deposition conditions comprise at least three of said cycles, each optionally followed by a purge step with an inert gas; followed by II. introducing into said reaction zone a second cycle of pulse sequences comprising introducing compounds D and E into said reaction zone, in either order, each optionally followed by a purge step with an inert gas:
  D. a titanium precursor; and
  E. a nitrogen-containing reducing gas; and
repeating said second cycle of pulse sequences for a sufficient number of iterations to establish a titanium nitride nucleation to provide a film having a thickness of about 10 Å to about 15 Å.

In another aspect (IV), the invention provides a process for depositing a metal nitride on the surface of a substrate, which comprises the process of claim 6 below, further comprising introducing into the reaction zone (i) at least one metal precursor and (i) at least one nitrogen containing reducing gas, in either order, each followed by an optional purge step with an inert gas, to define a third cycle of pulse sequences, and repeating said third cycle of pulse sequences until a metal nitride film of a desired thickness has been obtained.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A pretreatment process for metal nitride nucleation on the surface of a microelectronic device substrate in a reaction zone, which comprises:
   I. introducing compounds chosen from A, B, and C into a reaction zone under pulsed vapor deposition conditions, wherein said pulsed vapor deposition conditions comprise a plurality of pulse sequences, wherein at least two of compounds, A, B, and C are introduced into said reaction zone, one of which is A, sequentially and in any order, each optionally followed by a purge step with an inert gas, to define a cycle of pulse sequences, wherein said plurality comprises at least three cycles, wherein A, B, and C are defined as:
     A. a precursor chosen from silicon-containing halides and silicon-containing amides, wherein A is bis-t-amyl ethylene silylene;
     B. a metal precursor, wherein said metal is chosen from titanium, tantalum, molybdenum, tungsten, and niobium; and
     C. a nitrogen-containing reducing gas, wherein said nitrogen-containing reducing gas is introduced into said reaction zone once or twice per cycle of each pulse sequence.

2. The process of claim 1, wherein the cycle of pulse sequences is repeated about 3 to about 15 times.

3. The process of claim 1, wherein B is TiCl$_4$.

4. The process of claim 1, wherein the pulse sequence is bis-t-amyl ethylene silylene; NH$_3$; TiCl$_4$; and NH$_3$.

5. A process for metal nitride nucleation on the surface of a microelectronic device substrate in a reaction zone, the process comprising the process of claim 1, further comprising:
   introducing into said reaction zone a second cycle of pulse sequences comprising introducing compounds D and E into said reaction zone, in either order, each optionally followed by purging with an inert gas:
     D. a metal precursor, wherein said metal is chosen from titanium, tantalum, molybdenum, tungsten, and niobium; and
     E. a nitrogen-containing reducing gas; and
   repeating said second cycle of pulse sequences for a sufficient number of iterations to establish a metal nitride nucleation on a substrate to afford a coverage representing less than about 1% of void areas in a film having a thickness of about 10 Å to about 15 Å.

6. The process of claim 5, wherein the metal precursor is chosen from TiCl$_4$; TiI$_4$; Ti(NCH$_2$CH$_3$)Cl; tetrakis(dimethylamido)titanium; TaCl$_5$; MoCl$_3$; WCl$_5$; and NbCl$_5$.

7. The process of claim 5, wherein the metal nitride is chosen from titanium nitride, tantalum nitride, molybdenum nitride, tungsten nitride, and niobium nitride.

8. The process of claim 5, wherein the nitrogen containing reducing gas is chosen from ammonia, hydrazine, methyl hydrazine, t-butyl hydrazine, 1,1-dimethylhydrazine, and 1,2-dimethylhydrazine.

9. The process of claim 5, wherein the first cycle of pulse sequences is repeated about 3 to about 15 times.

10. The process of claim 5, wherein the metal precursor is chosen from $TiCl_4$, $TiI_4$, $Ti(NCH_2CH_3)Cl$, and $TaCl_5$.

11. A pretreatment process for metal nitride nucleation on the surface of a microelectronic device substrate in a reaction zone, which comprises:
   I. introducing compounds chosen from A, B, and C into a reaction zone under pulsed vapor deposition conditions, wherein said pulsed vapor deposition conditions comprise a plurality of pulse sequences, wherein at least two of compounds, A, B, and C are introduced into said reaction zone, one of which is A, sequentially and in any order, each optionally followed by a purge step with an inert gas, to define a cycle of pulse sequences, wherein said plurality comprises at least three cycles, wherein A, B, and C are defined as:
      A. a precursor chosen from silicon-containing halides and silicon-containing amides, wherein A is a compound of the formula

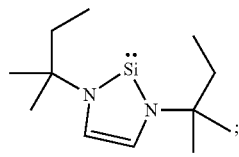

B. a metal precursor, wherein said metal is chosen from titanium, tantalum, molybdenum, tungsten, and niobium; and
      C. a nitrogen-containing reducing gas, wherein said nitrogen-containing reducing gas is introduced into said reaction zone once or twice per cycle of each pulse sequence.

12. The process of claim 11, wherein the metal precursor is chosen from $TiCl_4$; $TiI_4$; $Ti(NCH_2CH_3)Cl$; tetrakis(dimethylamido)titanium; $TaCl_5$; $MoCl_3$; $WCl_5$; and $NbCl_5$.

13. The process of claim 11, wherein the metal nitride is chosen from titanium nitride, tantalum nitride, molybdenum nitride, tungsten nitride, and niobium nitride.

14. The process of claim 11, wherein the nitrogen containing reducing gas is chosen from ammonia, hydrazine, methyl hydrazine, t-butyl hydrazine, 1,1-dimethylhydrazine, and 1,2-dimethylhydrazine.

15. A pretreatment process for metal nitride nucleation on the surface of a microelectronic device substrate in a reaction zone, which comprises:
   I. introducing compounds chosen from A, B, and C into a reaction zone under pulsed vapor deposition conditions, wherein said pulsed vapor deposition conditions comprise a plurality of pulse sequences, wherein at least two of compounds, A, B, and C are introduced into said reaction zone, one of which is A, sequentially and in any order, each optionally followed by a purge step with an inert gas, to define a cycle of pulse sequences, wherein said plurality comprises at least three cycles, wherein A, B, and C are defined as:
      A. a precursor chosen from silicon-containing halides and silicon-containing amides, wherein A is a compound of the formula

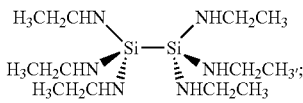

B. a metal precursor, wherein said metal is chosen from titanium, tantalum, molybdenum, tungsten, and niobium; and
      C. a nitrogen-containing reducing gas, wherein said nitrogen-containing reducing gas is introduced into said reaction zone once or twice per cycle of each pulse sequence.

16. The process of claim 15, wherein the metal precursor is chosen from $TiCl_4$; $TiI_4$; $Ti(NCH_2CH_3)Cl$; tetrakis(dimethylamido)titanium; $TaCl_5$; $MoCl_3$; $WCl_5$; and $NbCl_5$.

17. The process of claim 15, wherein the metal nitride is chosen from titanium nitride, tantalum nitride, molybdenum nitride, tungsten nitride, and niobium nitride.

18. The process of claim 15, wherein the nitrogen containing reducing gas is chosen from ammonia, hydrazine, methyl hydrazine, t-butyl hydrazine, 1,1-dimethylhydrazine, and 1,2-dimethylhydrazine.

* * * * *